(12) United States Patent
Liu et al.

(10) Patent No.: US 8,268,398 B2
(45) Date of Patent: *Sep. 18, 2012

(54) METHOD FOR MAKING CARBON NANOTUBE COMPOSITE STRUCTURE

(75) Inventors: Kai Liu, Beijing (CN); Kai-Li Jiang, Beijing (CN); Liang Liu, Beijing (CN); Shou-Shan Fan, Beijing (CN)

(73) Assignees: Tsinghua Universtiy, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 911 days.

This patent is subject to a terminal disclaimer.

(21) Appl. No.: 12/321,570

(22) Filed: Jan. 22, 2009

(65) Prior Publication Data
US 2009/0196981 A1 Aug. 6, 2009

(51) Int. Cl.
*C23C 16/00* (2006.01)
(52) U.S. Cl. ............... 427/250; 427/255.7; 427/117; 204/192.1
(58) Field of Classification Search ............. 427/250, 427/255.7, 177; 117/84; 204/192.1
See application file for complete search history.

(56) References Cited

U.S. PATENT DOCUMENTS

| | | | |
|---|---|---|---|
| 4,132,828 A | 1/1979 | Nakamura et al. | |
| 4,461,923 A | 7/1984 | Bogese, II | |
| 7,390,963 B2 | 6/2008 | Scherer | |
| 7,413,474 B2 | 8/2008 | Liu et al. | |
| 7,704,480 B2 | 4/2010 | Jiang et al. | |
| 7,750,240 B2 | 7/2010 | Jiang et al. | |
| 2004/0020681 A1 | 2/2004 | Hjortstam et al. | |
| 2004/0051432 A1 | 3/2004 | Jiang et al. | |
| 2004/0053780 A1 | 3/2004 | Jiang et al. | |
| 2004/0058153 A1* | 3/2004 | Ren et al. | 428/408 |
| 2005/0208304 A1* | 9/2005 | Collier et al. | 428/403 |
| 2006/0231946 A1* | 10/2006 | Pan et al. | 257/712 |
| 2007/0075619 A1 | 4/2007 | Jiang et al. | |
| 2007/0151744 A1 | 7/2007 | Chen | |
| 2007/0166223 A1 | 7/2007 | Jiang et al. | |
| 2007/0284145 A1 | 12/2007 | Scherer | |
| 2007/0284987 A1 | 12/2007 | Liu et al. | |
| 2007/0293086 A1 | 12/2007 | Liu et al. | |
| 2008/0095694 A1 | 4/2008 | Nakayama et al. | |
| 2008/0170982 A1 | 7/2008 | Zhang et al. | |
| 2009/0061125 A1* | 3/2009 | Shekhawat et al. | 428/34.1 |
| 2009/0208708 A1 | 8/2009 | Wei et al. | |

(Continued)

FOREIGN PATENT DOCUMENTS
CN 1483667 3/2004
(Continued)

OTHER PUBLICATIONS

Herrmann, C.F., et al., "Multilayer and functional coatings on carbon nanotubes using atomic layer deposition". Applied Physics Letters 87, 123110 (2005), pp. 1-3.*

(Continued)

*Primary Examiner* — Bret Chen
(74) *Attorney, Agent, or Firm* — Altis Law Group, Inc.

(57) ABSTRACT

A method for making a carbon nanotube composite structure, the method comprising the steps of: providing a carbon nanotube structure having a plurality of carbon nanotubes; and forming at least one conductive coating on a plurality of the carbon nanotubes in the carbon nanotube structure to achieve a carbon nanotube composite structure, wherein the conductive coating comprises of a conductive layer.

20 Claims, 7 Drawing Sheets providing a carbon nanotube structure having a plurality of carbon nanotubes

↓ forming at least one conductive coating on a plurality of the carbon nanotubes in the carbon nanotube structure to achieve a carbon nanotube composite structure, wherein the conductive coating comprises of a conductive layer

U.S. PATENT DOCUMENTS

| | | | |
|---|---|---|---|
| 2009/0208742 | A1 | 8/2009 | Zhu et al. |
| 2009/0212430 | A1 | 8/2009 | Wyland |
| 2010/0297441 | A1 | 11/2010 | Zhu |

FOREIGN PATENT DOCUMENTS

| | | |
|---|---|---|
| CN | 1484275 | 3/2004 |
| CN | 1948144 | 4/2007 |
| CN | 1982209 | 6/2007 |
| CN | 1992099 | 7/2007 |
| CN | 101003909 | 7/2007 |
| CN | 101090011 A | 12/2007 |
| JP | 2004-107196 | 4/2004 |
| JP | 2005-96024 | 4/2005 |
| JP | 2005-235409 | 9/2005 |
| JP | 2005-235429 | 9/2005 |
| JP | 2005-302309 | 10/2005 |
| JP | 2004-342494 | 12/2005 |
| JP | 2006-147170 | 6/2006 |
| JP | 2009-536434 | 12/2007 |
| JP | 2008-517182 | 5/2008 |
| JP | 2008-519454 | 6/2008 |
| TW | 200713384 | 4/2007 |
| TW | 200724486 | 7/2007 |
| TW | 200800798 | 1/2008 |
| TW | 200802414 | 1/2008 |
| TW | 200939252 | 9/2009 |
| WO | WO2005007926 | 1/2005 |
| WO | WO2005102924 | 11/2005 |
| WO | 2006026539 | 3/2006 |

OTHER PUBLICATIONS

Suzuura, Hidekatsu, "Conductance of twisted carbon nanotubes". Physica E 34 (2006) 674-677.*

Zhang, Mei, et al., "Multifunctional Carbon Nanotube Yarns by Downsizing an Ancient Technology". Science vol. 36, Nov. 19, 2004, pp. 1358-1361.*

Y. Zhang et al. Metal coating on suspended carbon nanotubes and its implication to metal-tube interaction, Chemical Physics Letters, Nov. 24, 2000, 35-41, 331, Elsevier Science.

Mei Zhang et al., "Strong, Transparent, Multifunctional, Carbon Nanotube Sheets", Science, Aug. 19, 2005, pp. 1215-1219, vol. 309, U.S. Washington.

Y. Zhang et al., "Metal coating on suspended carbon nanotuhes and its implication to metal-tube interaction", Chemical Physics Letters, Nov 24, 2000, pp. 35-41, vol. 331.

Youngmi Cho et al., "Electronic Structure Tailoring and Selective Adsorption Mechanism of Metal-coated Nanotubes", Nanoletters, Dec. 18, 2007, pp. 81-86 vol. 8, U.S.

Li et al., Electroless Plating of Carbon Nanotube with Gold, Journal of Materials Science & Engineering, vol. 22, No. 1, pp. 48-51, Feb. 2004. Passage 2 of Left Column of p. 48 and Paragraph 3.2 of pp. 49-50 may be relevant.

Li Xia et al. "Electroless Planting of Carbon Nanotube with Gold" Journal of Materials Science & Engineering, vol. 22 (2004);pp. 48-51.

* cited by examiner

METHOD FOR MAKING CARBON NANOTUBE COMPOSITE STRUCTURE

RELATED APPLICATIONS

This application is related to commonly-assigned application entitled, "COAXIAL CABLE", U.S. patent application Ser. No. 12/321,572, filed Jan. 22, 2009; "COAXIAL CABLE", U.S. patent application Ser. No. 12/321,569, filed Jan. 22, 2009; "CARBON NANUTUBE WIRE-LIKE STRUCTURE", U.S. patent application Ser. No. 12/321,568, filed Jan. 22, 2009; "METHOD FOR MAKING CARBON NANUTUBE TWISTED WIRE", U.S. patent application Ser. No. 12/321,551, filed Jan. 22, 2009; "CARBON NANUTUBE COMPOSITE FILM", U.S. patent application Ser. No. 12/321,557, filed Jan. 22, 2009; "METHOD FOR MAKING COAXIAL CABLE", U.S. patent application Ser. No. 12/321,573, filed Jan. 22, 2009. The disclosure of the above-identified applications are incorporated herein by reference.

BACKGROUND

1. Technical Field

The present invention relates to methods for making composite structures and, particularly, to a method for making a carbon nanotube composite structure.

2. Discussion of Related Art

Carbon nanotubes (CNTs) are a novel carbonaceous material and have received a great deal of interest since the early 1990s. Carbon nanotubes have interesting and potentially useful heat conducting, electrical conducting, and mechanical properties. The carbon nanotubes can be dispersed in a matrix to form a composite material. Then, the composite material can be applied with screen-printing or chemical vapor deposition methods on a substrate to form a carbon nanotube composite material. The carbon nanotube composite material has properties of both the carbon nanotubes and the matrix material.

However, the above-mentioned methods for making the carbon nanotube composite structure have many disadvantages. Firstly, the methods are relatively complex and costly. Secondly, the carbon nanotubes are prone to aggregate in the composite film. Thus, the strength and toughness of the composite film are relatively low. Thirdly, the carbon nanotubes in the composite film are disorganized and not arranged in any particular direction. Thus, the excellent heat and electrical conductivity properties of carbon nanotubes cannot be fully utilized.

What is needed, therefore, is a carbon nanotube composite structure and method for making the same in which cheaper and a higher quality carbon nanotube composite structure than presently available is produced.

BRIEF DESCRIPTION OF THE DRAWINGS

Many aspects of the present carbon nanotube composite structure and method for making the same can be better understood with references to the accompanying drawings. The components in the drawings are not necessarily drawn to scale, the emphasis instead being placed upon clearly illustrating the principles of the present carbon nanotube composite structure and method for making the same.

Figure 1:
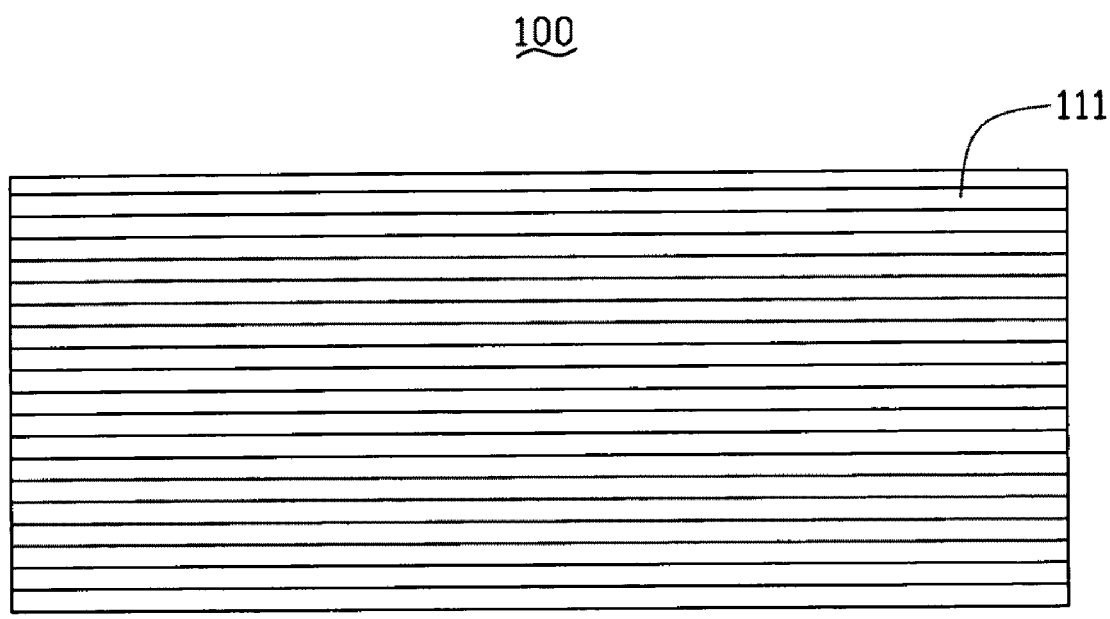
FIG. 1 is a schematic view of a carbon nanotube composite structure in accordance with a present embodiment.

Corresponding reference characters indicate corresponding parts throughout the several views. The exemplifications set out herein illustrate at least one embodiment of the present carbon nanotube composite structure and method for making the same, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present carbon nanotube composite structure and method for making the same.

Referring to FIG. 1, a carbon nanotube composite structure 100 includes a plurality of carbon nanotubes 111 and at least one conductive coating (not shown) covered on (e.g. surrounded) an outer surface of each carbon nanotube. The carbon nanotube composite structure 100 is ordered, with the carbon nanotubes 111 therein substantially parallel to a surface of the carbon nanotube composite structure 100 and aligned along a same direction. The carbon nanotube composite structure 100 includes a plurality of successively oriented carbon nanotubes 111 joined end-to-end by van der Waals attractive force. The carbon nanotubes 111 have a substantially equal length and are parallel to each other to form carbon nanotube segments. Each carbon nanotube segment includes a plurality of carbon nanotubes parallel to each other, and combined by van der Waals attractive force therebetween. The carbon nanotube segments can vary in width, thickness, uniformity and shape. The carbon nanotube segments are joined end-to-end by van der Waals attractive force to form the carbon nanotube composite structure 100. The plurality of carbon nanotubes 111 in the carbon nanotube composite structure 100 are joined end-to-end to form a free-standing carbon nanotube composite structure 100. The "free-standing" means that the carbon nanotube composite structure 100 does not have to be formed on a surface of a substrate to be supported by the substrate, but sustain the film-shape by itself due to the great van der Waals attractive force between the adjacent carbon nanotubes in the carbon nanotube composite structure 100.

Figure 2:
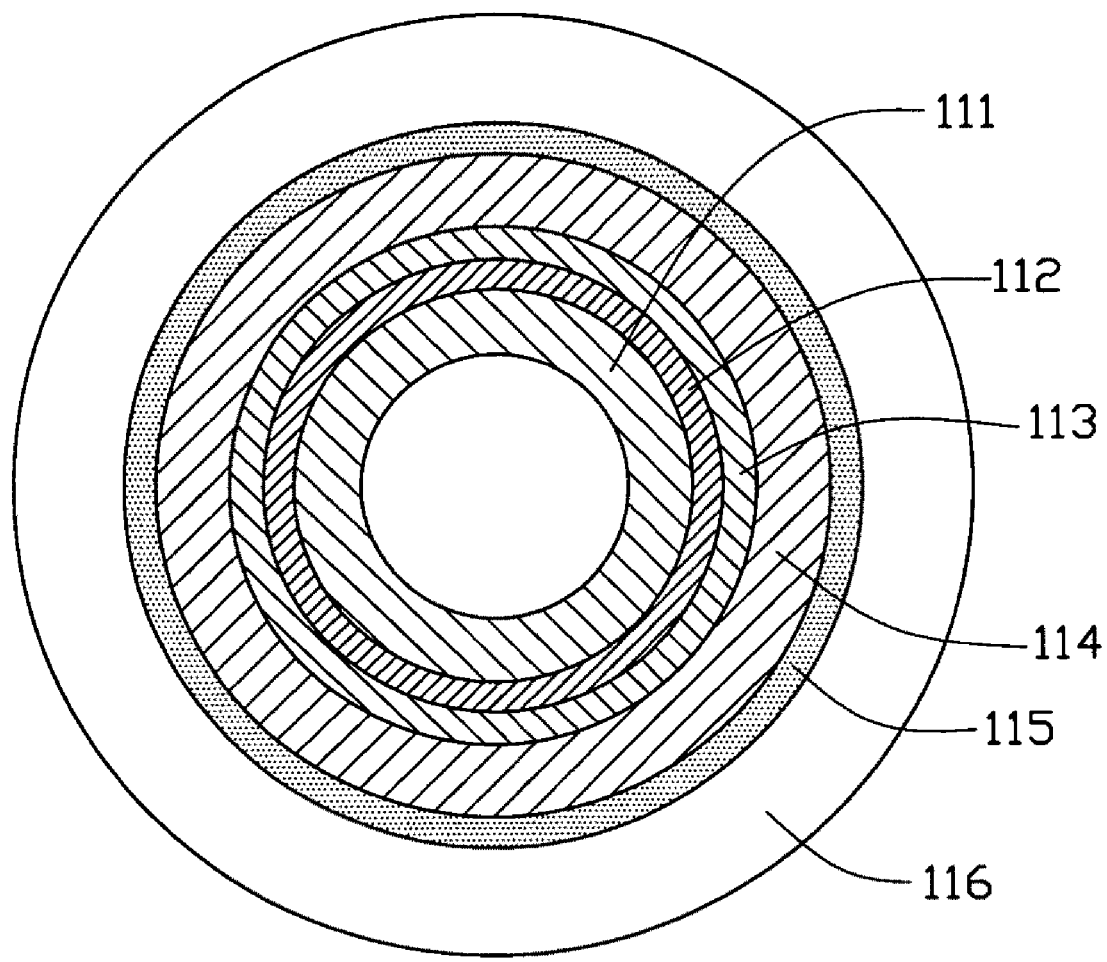
FIG. 2 is a schematic view of a single carbon nanotube in the carbon nanotube composite structure of FIG. 1.

Referring to FIG. 2, each carbon nanotube 111 in the carbon nanotube composite structure 100 is covered by a conductive coating on the outer surface thereof. More specifically, the at least one conductive coating of the present embodiment further includes a wetting layer 112, a transition layer 113, a conductive layer 114, and an anti-oxidation layer 115. The wetting layer 112 is the most inner layer, covers the surface of the carbon nanotube 111, and combines directly with the carbon nanotube 111. The transition layer 113 covers and wraps the wetting layer 112. The conductive layer 114 covers and wraps the transition layer 113. The anti-oxidation layer 115 covers and wraps the conductive layer 114.

The carbon nanotube 111 cannot be adequately wetted by most metallic materials, thus, the wetting layer 112 is arranged for wetting the carbon nanotube 111, as well as combining the carbon nanotube 111 with the conductive layer 114. The material of the wetting layer 112 can be selected from a group consisting of iron (Fe), cobalt (Co), nickel (Ni), palladium (Pd), titanium (Ti), and alloys thereof. A thickness of the wetting layer 112 ranges from about 1 to about 10 nanometers. In the present embodiment, the material of the wetting layer 112 is Ni and the thickness is about 2 nanometers. The wetting layer 112 is optional.

The transition layer 113 is arranged for combining the wetting layer 112 with the conductive layer 114. The material of the transition layer 113 can be combined with the material of the wetting layer 112 as well as the material of the conductive layer 114, such as Copper (Cu), silver (Ag), or alloys thereof. A thickness of the transition layer 113 ranges from about 1 to about 10 nanometers. In the present embodiment, the material of the transition layer 113 is Cu and the thickness is about 2 nanometers. The transition layer 113 is optional.

The conductive layer 114 is arranged for enhancing the conductivity of the carbon nanotube composite structure 100. The material of the conductive layer 114 can be selected from a group consisting of Cu, Ag, gold (Au) and alloys thereof. A thickness of the conductive layer 114 ranges from about 1 to about 20 nanometers. In the present embodiment, the material of the conductive layer 114 is Ag and the thickness is about 10 nanometers.

The anti-oxidation layer 115 is arranged for preventing the oxidation of the carbon nanotube composite structure 100 in the making process. The oxidation of the carbon nanotube composite structure 100 will reduce the conductivity thereof. The material of the anti-oxidation layer 115 can be Au, platinum (Pt), and any other anti-oxidation metallic materials or alloys thereof. A thickness of the anti-oxidation layer 115 ranges from about 1 to about 10 nanometers. In the present embodiment, the material of the anti-oxidation layer 115 is Pt and the thickness is about 2 nanometers. The anti-oxidation layer 115 is optional.

Furthermore, a strengthening layer 116 can be applied with the conductive coating to enhance the strength of the carbon nanotube composite structure 100. The material of the strengthening layer 116 can be a polymer with high strength, such as polyvinyl acetate (PVA), polyvinyl chloride (PVC), polyethylene (PE), or paraphenylene benzobisoxazole (PBO). A thickness of the strengthening layer 116 ranges from about 0.1 micrometers to 1 micrometer. In the present embodiment, the strengthening layer 116 covers the anti-oxidation layer 115, the material of the strengthening layer 116 is PVA, and the thickness of the strengthening layer is about 0.5 microns. The strengthening layer 116 is optional.

Figure 3:
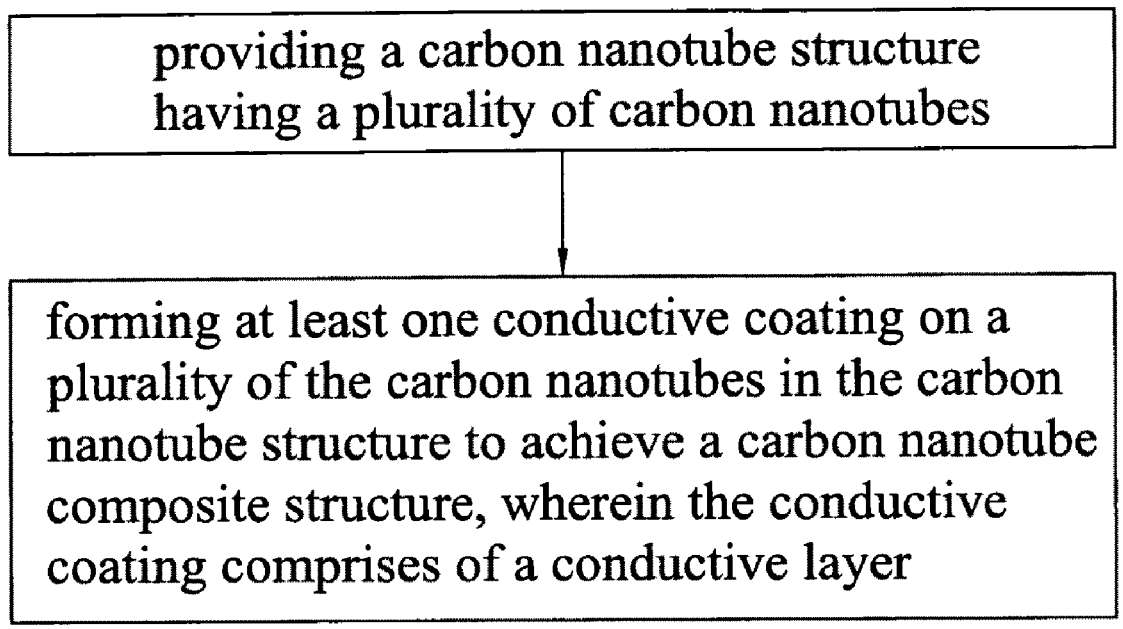
FIG. 3 is a flow chart of a method for making the carbon nanotube composite structure of FIG. 1.
Figure 4:
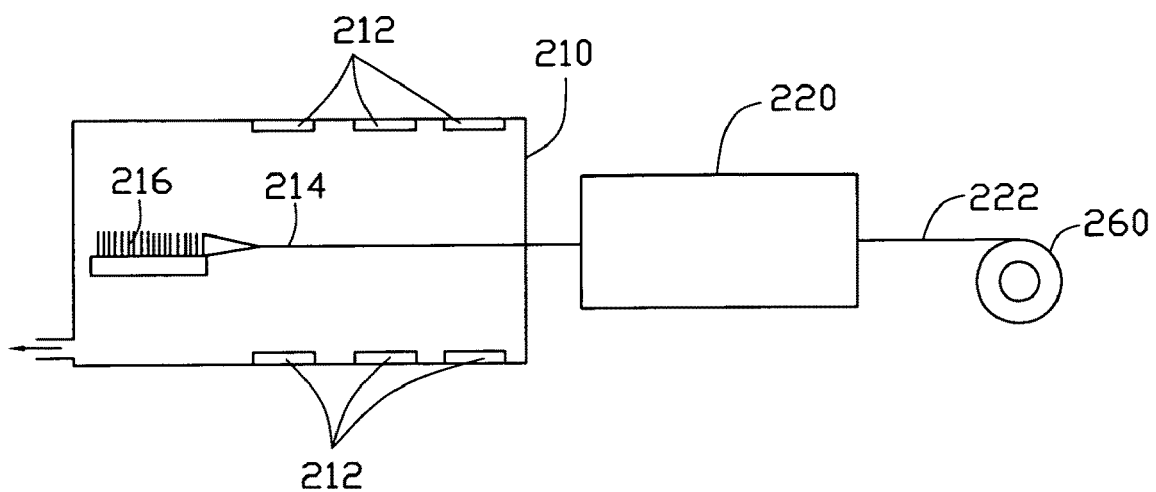
FIG. 4 is an apparatus for making the carbon nanotube composite structure of FIG. 1.

Referring to FIG. 3 and FIG. 4, a method for making the carbon nanotube composite structure 222 includes the following steps: (a) providing a carbon nanotube structure 214 having a plurality of carbon nanotubes; and (b) forming at least one conductive coating on each of the carbon nanotubes in the carbon nanotube structure 214 to achieve a carbon nanotube composite structure 222.

In step (a), the carbon nanotube structure 214 can be a carbon nanotube film. The carbon nanotube film includes a plurality of carbon nanotubes, and there are interspaces between adjacent two carbon nanotubes. Carbon nanotubes in the carbon nanotube film can parallel to a surface of the carbon nanotube film. A distance between adjacent two carbon nanotubes can be larger than a diameter of the carbon nanotubes. The carbon nanotube film can have a free-standing structure. The carbon nanotube film can be formed by the following substeps: (a1) providing a carbon nanotube array 216 (which includes previously identified super-aligned arrays); (a2) pulling out a carbon nanotube film 214 from the carbon nanotube array 216 by using a tool (e.g., adhesive tape, pliers, tweezers, or another tool allowing multiple carbon nanotubes to be gripped and pulled simultaneously).

In step (a1), a given carbon nanotube array 216 can be formed by the following substeps: (a11) providing a substantially flat and smooth substrate; (a12) forming a catalyst layer on the substrate; (a13) annealing the substrate with the catalyst layer in air at a temperature ranging from about 700° C. to about 900° C. for about 30 to 90 minutes; (a14) heating the substrate with the catalyst layer to a temperature ranging from about 500° C. to about 740° C. in a furnace with a protective gas therein; and (a15) supplying a carbon source gas to the furnace for about 5 to 30 minutes and growing the carbon nanotube array 216 on the substrate.

In step (a11), the substrate can be a P-type silicon wafer, an N-type silicon wafer, or a silicon wafer with a film of silicon dioxide thereon. In the present embodiment, a 4-inch P-type silicon wafer is used as the substrate.

In step (a12), the catalyst can be made of iron (Fe), cobalt (Co), nickel (Ni), or any alloy thereof.

In step (a14), the protective gas can be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The carbon nanotube array 216 can be about 200 to about 400 microns in height and include a plurality of carbon nanotubes parallel to each other and approximately perpendicular to the substrate. The carbon nanotubes in the carbon nanotube array 216 can be single-walled carbon nanotubes, double-walled carbon nanotubes, or multi-walled carbon nanotubes. Diameters of the single-walled carbon nanotubes range from about 0.5 nanometers to about 10 nanometers. Diameters of the double-walled carbon nanotubes range from about 1 nanometer to about 50 nanometers. Diameters of the multi-walled carbon nanotubes range from about 1.5 nanometers to about 50 nanometers.

The carbon nanotube array 216 formed under the above conditions is essentially free of impurities such as carbonaceous or residual catalyst particles. The carbon nanotubes in the carbon nanotube array 216 are closely packed together by van der Waals attractive force.

In step (a2), the carbon nanotube film 214 can be formed by the following substeps: (a21) selecting a plurality of carbon nanotube segments having a predetermined width from the carbon nanotube array 216; and (a22) pulling the carbon nanotube segments at an even/uniform speed to achieve a uniform carbon nanotube film 214.

In step (a21), the carbon nanotube segments having a predetermined width can be selected by using an adhesive tape such as the tool to contact the carbon nanotube array 216. Each carbon nanotube segment includes a plurality of carbon nanotubes parallel to each other. In step (a22), the pulling direction can be substantially perpendicular to the growing direction of the carbon nanotube array 216.

Figure 5:
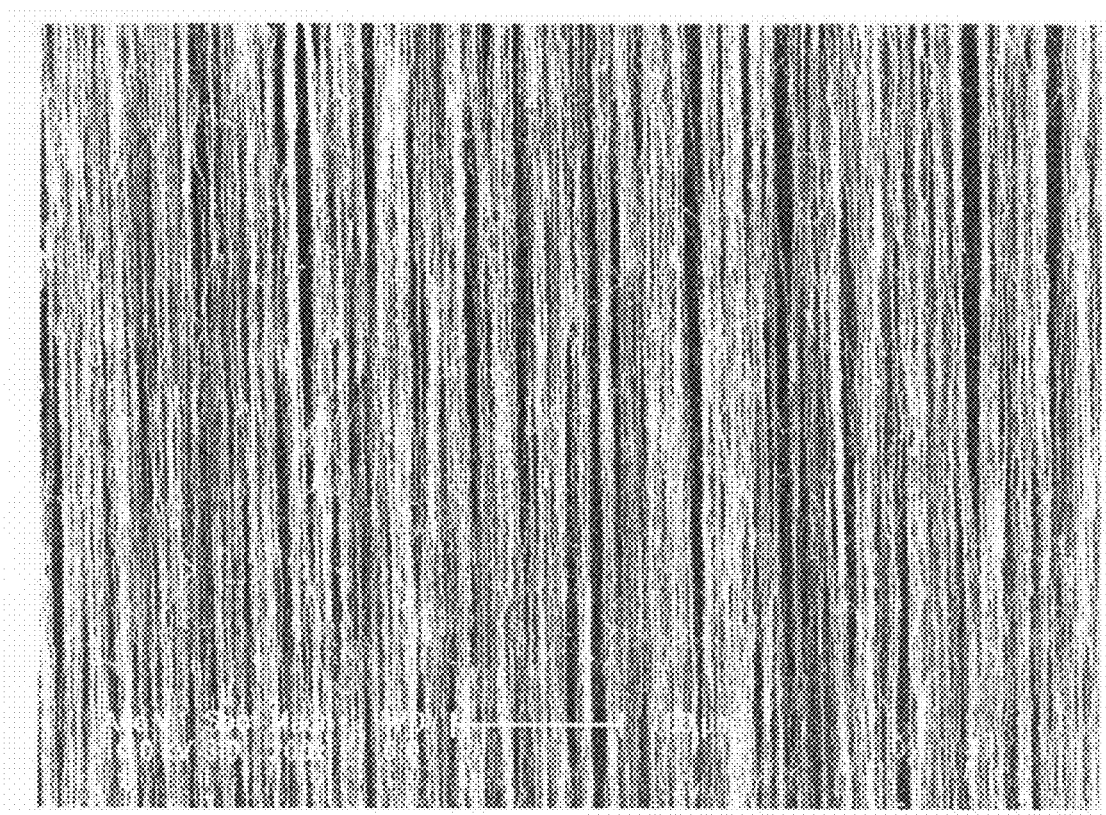
FIG. 5 shows a Scanning Electron Microscope (SEM) image of a carbon nanotube film used in the method for making the carbon nanotube composite structure of FIG. 1.

More specifically, during the pulling process, as the initial carbon nanotube segments are drawn out, other carbon nanotube segments are also drawn out end-to-end due to the van der Waals attractive force between ends of adjacent segments. This process of drawing ensures that a continuous, uniform carbon nanotube film 214 having a predetermined width can be formed. Referring to FIG. 5, the carbon nanotube film 214 includes a plurality of carbon nanotubes joined end-to-end. The carbon nanotubes in the carbon nanotube film 214 are all substantially parallel to the pulling/drawing direction of the carbon nanotube film 214, and the carbon nanotube film 214 produced in such manner can be selectively formed to have a predetermined width. The carbon nanotube film 214 formed by the pulling/drawing method has superior uniformity of thickness and conductivity over a typically disordered carbon nanotube film 214. Furthermore, the pulling/drawing method is simple, fast, and suitable for industrial applications.

The length of the carbon nanotube film 214 depends on a size of the carbon nanotube array 216. The length of the carbon nanotube film 214 can be arbitrarily set as desired and can be above 100 meters. When the substrate is a 4-inch P-type silicon wafer, as in the present embodiment, the width of the carbon nanotube film 216 ranges from about 0.01 centimeters to about 10 centimeters, and the thickness of the carbon nanotube film 216 ranges from about 0.5 nanometers to about 100 microns.

In step (b), the at least one conductive coating can be formed on the carbon nanotube film by means of physical vapor deposition (PVD) such as a vacuum evaporation or a sputtering. In the present embodiment, the at least one conductive coating is formed by means of vacuum evaporation.

The vacuum evaporation method for forming the at least one conductive coating of step (b) can further include the following substeps: (b1) providing a vacuum container 210 including at least one vaporizing source 212; and (b2) heating the at least one vaporizing source 212 to deposit the conductive coating on a surface of the carbon nanotube film 214.

In step (b1), the vacuum container 210 includes a depositing zone therein. At least one pair of vaporizing sources 212 includes an upper vaporizing source 212 located on a top surface of the depositing zone, and a lower vaporizing source 212 located on a bottom surface of the depositing zone. The two vaporizing sources 212 are opposite to each other to provide the desired coverage. Each pair of vaporizing sources 212 includes a type of metallic material. The materials in different pairs of vaporizing sources 212 can be arranged in the order of conductive materials orderly formed on the carbon nanotube film. The pairs of vaporizing sources 212 can be arranged along a pulling direction of the carbon nanotube film 214 on the top and bottom surface of the depositing zone. The carbon nanotube film 214 is located in the vacuum container 210 and between the upper vaporizing source 212 and the lower vaporizing source 212. There is a distance between the carbon nanotube film 214 and the vaporizing sources 212. An upper surface of the carbon nanotube film 214 faces the upper vaporizing sources 212. A lower surface of the carbon nanotube film 214 faces the lower vaporizing sources 212. The vacuum container 210 can be evacuated by use of a vacuum pump (not shown).

Figure 6:
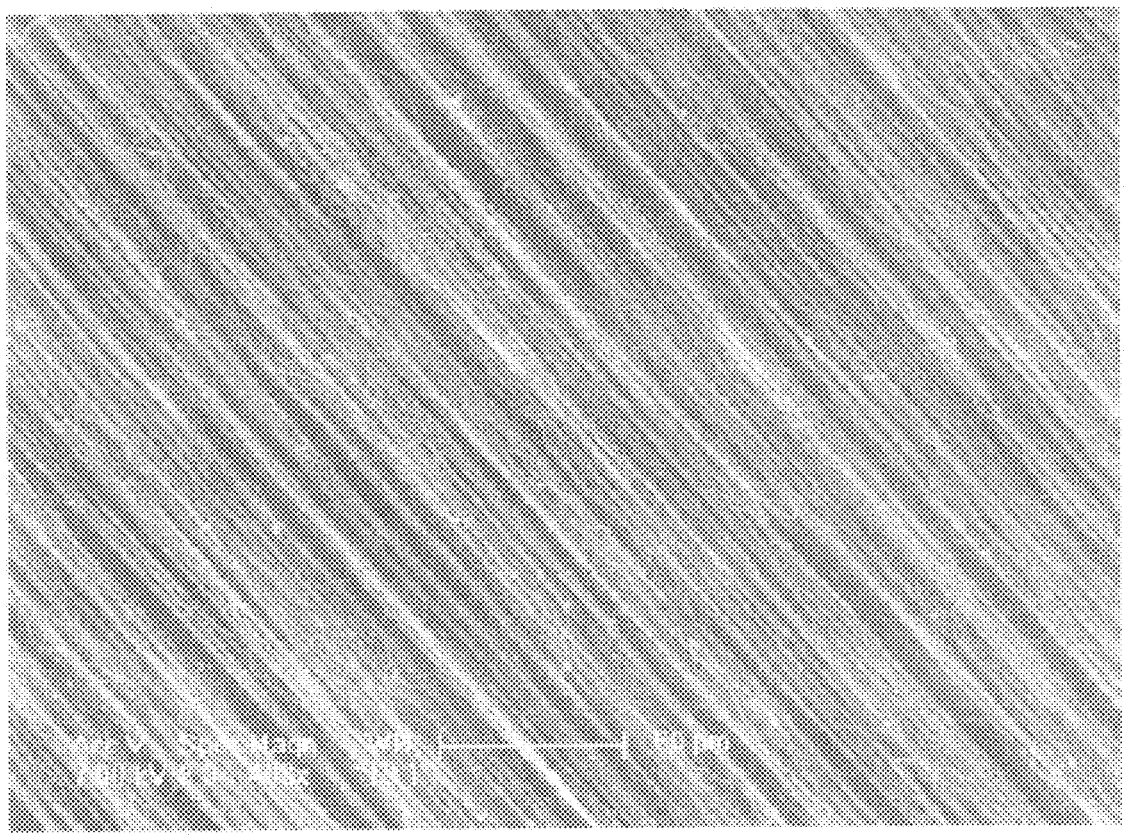
FIG. 6 shows a Scanning Electron Microscope (SEM) image of the carbon nanotube composite structure of FIG. 1.
Figure 7:
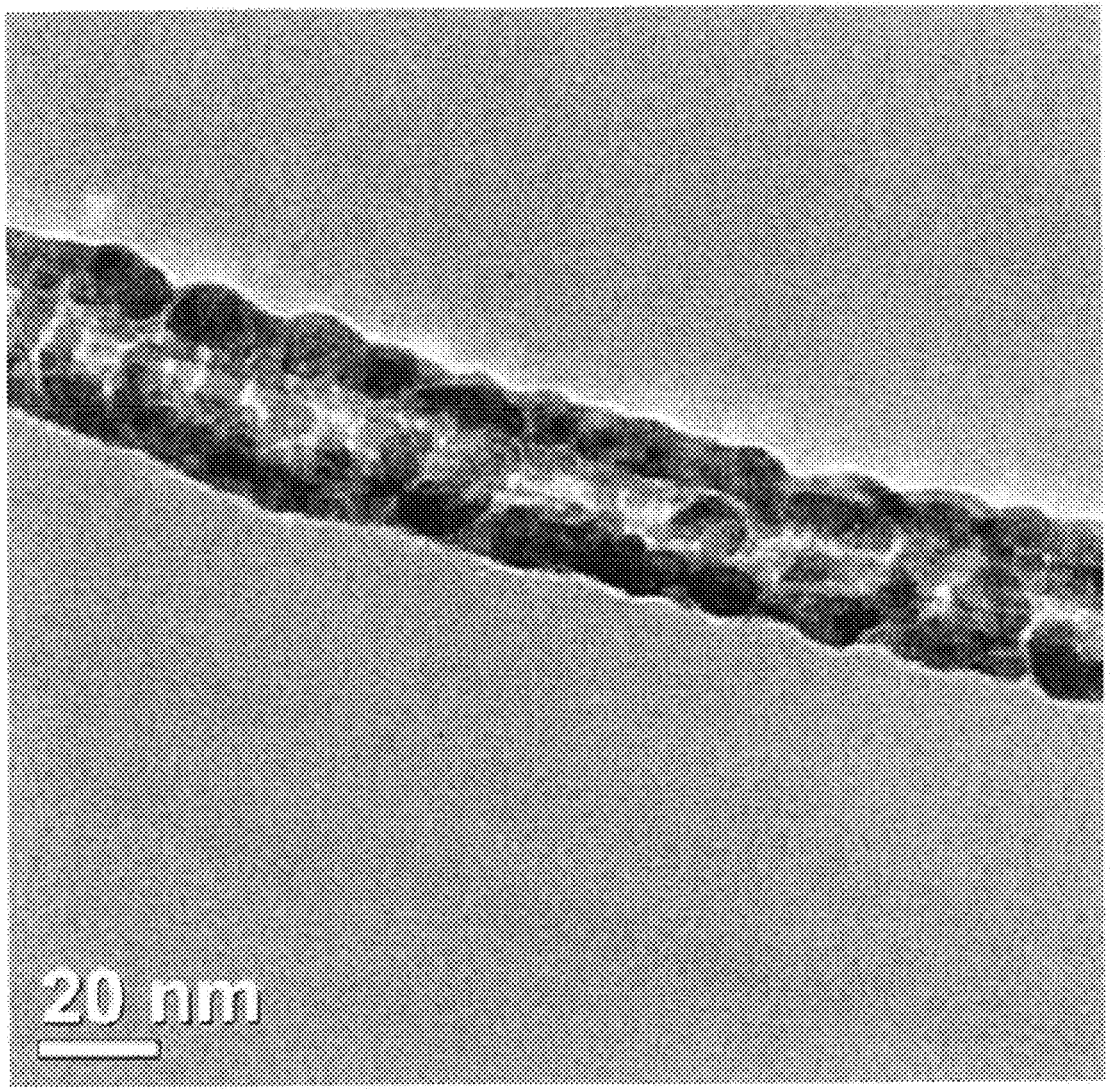
FIG. 7 shows a Transmission Electron Microscope (TEM) image of the carbon nanotube composite structure of FIG. 1.

In step (b2), the vaporizing source 212 can be heated by a heating device (not shown). The material in the vaporizing source 212 is vaporized or sublimed to form a gas. The gas meets the cold carbon nanotube film 214 and coagulates on the upper surface and the lower surface of the carbon nanotube film 214. Due to a plurality of interspaces existing between the carbon nanotubes in the carbon nanotube film 214, in addition to the carbon nanotube film 214 being relatively thin, the conductive material can be infiltrated in the interspaces in the carbon nanotube film 214 between the carbon nanotubes. As such, the conductive material can be deposited on the outer surface of most, if not all, of the single carbon nanotubes. A microstructure of the carbon nanotube composite structure 222 is shown in FIG. 6 and FIG. 7.

It is to be understood that a depositing area of each vaporizing source 212 can be adjusted by varying the distance between two adjacent vaporizing sources 212 or the distance between the carbon nanotube film and the vaporizing source 212. Several vaporizing sources 212 can be heating simultaneously, while the carbon nanotube film 214 is pulled through the depositing zone between the vaporizing sources 212 to form a conductive coating.

To increase a density of the gas in the depositing zone, and prevent oxidation of the conductive material, the vacuum degree in the vacuum container 210 is above 1 pascal (Pa). In the present embodiment, the vacuum degree is about $4 \times 10^{-4}$ Pa.

It is to be understood that the carbon nanotube array 216 formed in step (a1) can be directly placed in the vacuum container 210. The carbon nanotube film 214 can be pulled in the vacuum container 210 and successively pass each vaporizing source 212, with each conductive coating continuously depositing thereon. Thus, the pulling step and the depositing step can be processed simultaneously.

The method for forming the composite material can include the following steps: forming a wetting layer on a surface of the carbon nanotube film 214; forming a transition layer on the wetting layer; forming a conductive layer on the transition layer; and forming an anti-oxidation layer on the conductive layer. In the above-described method, the steps of forming the wetting layer, the transition layer, and the anti-oxidation layer are optional. In the present embodiment, the method for forming the composite material includes the following steps: forming a wetting layer on a surface of the carbon nanotube film 214; and forming a conductive layer on the wetting layer.

It is to be understood that the method for forming at least one conductive coating on each of the carbon nanotubes in the carbon nanotube film 214 in step (b) can be a physical method such as vacuum evaporating or sputtering as described above, and can also be a chemical method such as electroplating or electroless plating. In the chemical method, the carbon nanotube film 214 can be disposed in a chemical solution.

Step (b) further including forming a strengthening layer outside the at least one conductive coating. More specifically, the carbon nanotube film 214 with the at least one conductive coating can be immersed in a container 220 with a liquid polymer therein. Thus, the entire surface of the carbon nanotube film 214 can be soaked with the liquid polymer. After concentration (e.g., being cured), a strengthening layer can be formed on the outside of the carbon nanotube film 214.

The carbon nanotube composite structure 222 can be further collected by a roller 260 by coiling the carbon nanotube composite structure 222 onto the roller 260.

Optionally, the steps of forming the carbon nanotube film 214, the at least one conductive coating, and the strengthening layer can be processed in a same vacuum container to achieve a continuous production of the carbon nanotube composite structure 222.

Optionally, to increase the transparency of the carbon nanotube film 214, before step (c), the carbon nanotube film 214 can be treated by a laser to decrease the thickness of the carbon nanotube film 214.

In the present embodiment, the frequency of the laser is 1064 nanometers, the output power of the laser is about 20 mW, the scanning rate of the laser is about 10 mm/s. A focus lens of a laser device is removed, and a diameter of a bright spot formed by the irradiation of the laser on the surface of the carbon nanotube film is about 3 millimeters.

Laser treated and untreated carbon nanotube composite structure 222 and carbon nanotube film 214 with different conductive coatings, the corresponding resistances, and the transmittances of a visible light with a frequency of 550 nanometers are compared in the table 1.

TABLE 1

| No. | Treated or untreated with laser | Wetting layer/ Thickness | Conductive layer/ Thickness | Ohms per square (Ω) | Transmittance (%) |
|---|---|---|---|---|---|
| 1 | untreated | — | — | 1684 | 85.2 |
| 2 | untreated | Ni/2 nm | — | 1656 | 79.0 |
| 3 | untreated | Ni/2 nm | Au/3 nm | 504 | 74.6 |
| 5 | untreated | Ni/2 nm | Au/5 nm | 216 | 72.5 |
| 6 | treated | Ni/2 nm | Au/5 nm | 2127 | 92.8 |
| 7 | treated | Ni/2 nm | Au/10 nm | 1173 | 92.7 |
| 8 | treated | Ni/2 nm | Au/15 nm | 495 | 90.7 |
| 9 | treated | Ni/2 nm | Au/20 nm | 208 | 89.7 |

As shown in table 1, due to the conductive coating outside the carbon nanotubes in the carbon nanotube composite film 214, the resistance of the carbon nanotube composite structure 222 is lower than the carbon nanotube film 214. However, the transmittance and transparency of the carbon nanotube composite structure 222 is decreased as the thickness of the conductive coating increased. After treated with laser, the transmittance and transparency of the carbon nanotube composite structure 222 is increased. To conclude from a large amount of testings, the resistance of the carbon nanotube composite structure 222 can be decreased to about 50Ω, the transmittance of visible light can be increased to 95%.

In the present embodiment, the resistance of the carbon nanotube film 214 is above 1600 ohms. After depositing a Ni layer and an Au layer, the resistance of the carbon nanotube composite structure 222 can reduce to 200 ohms. The transmitting ratio of visible light ranges ranges from about 70% to about 95%. Thus, the carbon nanotube composite structure 222 in the present embodiment has a low resistance and a high transparency, and can be used as a transparent conductive film.

The carbon nanotube composite structure provided in the present embodiment has at least the following superior properties. Firstly, the carbon nanotube composite structure includes a plurality of oriented carbon nanotubes joined end-to-end by van der Waals attractive force. Thus, the carbon nanotube composite structure has high strength and toughness. Secondly, the outer surface of each carbon nanotube is covered by the conductive coating. Thus, the carbon nanotube composite structure has high conductivity. Thirdly, the carbon nanotube composite structure has high transparency and can be used as a transparent conductive film. Fourthly, the method for forming the carbon nanotube composite structure is simple and relatively inexpensive. Additionally, the carbon nanotube composite structure can be formed continuously and, thus, a mass production thereof can be achieved.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that the above description and the claims drawn to a method may include some indication in reference to certain steps. However, the indication used is only to be viewed for identification purposes and not as a suggestion as to an order for the steps.

What is claimed is:

1. A method for making a carbon nanotube composite structure, the method comprising the steps of:
   (a) providing a carbon nanotube structure having a plurality of carbon nanotubes; and
   (b) forming at least one conductive coating on the plurality of carbon nanotubes in the carbon nanotube structure thereby a conductive layer is formed on the carbon nanotube structure, and forming a strengthening layer surrounding the at least one conductive coating, wherein forming the strengthening layer comprises immersing the carbon nanotube structure with at least one conductive coating on the plurality of carbon nanotubes in a container with a liquid polymer; soaking an entire surface of the carbon nanotube structure with the liquid polymer; taking the carbon nanotube structure out of the container; and curing the liquid polymer on the carbon nanotube structure, to achieve a carbon nanotube composite structure.

2. The method as claimed in claim 1, wherein in step (a), the plurality of carbon nanotubes are substantially parallel to the surface of the carbon nanotube structure.

3. The method as claimed in claim 1, wherein the carbon nanotube structure is a carbon nanotube film.

4. The method as claimed in claim 3, wherein the plurality of carbon nanotubes in the carbon nanotube film are substantially aligned along a same direction.

5. The method as claimed in claim 4, wherein the carbon nanotubes have approximately the same length and are joined end-to-end by van der Waals attractive force therebetween.

6. The method as claimed in claim 1, the step (b) comprising forming the at least one conductive coating by means of physical vapor deposition.

7. The method as claimed in claim 1, the step (b) comprising forming the at least one conductive coating by means of vacuum evaporation or sputtering.

8. The method as claimed in claim 7, wherein step (b) comprises of the following substeps:
   (b1) providing a vacuum container including at least one conductive material vaporizing source; and
   (b2) heating the at least one conductive material vaporizing source to deposit a conductive coating on the plurality of the carbon nanotubes in the carbon nanotube structure.

9. The method as claimed in claim 1, step (b) comprising applying the conductive layer to the carbon nanotube structure.

10. The method as claimed in claim 9, wherein a material of the conductive layer is selected from the group consisting of gold, silver, copper and any alloy thereof.

11. The method as claimed in claim 10, wherein a thickness of the conductive layer is in a range from about 1 to about 20 nanometers.

12. The method as claimed in claim 9, wherein step (b) further comprises forming a wetting layer before the conductive layer is applied to the carbon nanotube structure; and forming a transition layer on the wetting layer, and applying the conductive layer on the transition layer.

13. The method as claimed in claim 12, wherein the material of the wetting layer comprises of a material that is selected from the group consisting of nickel, palladium, titanium, and alloys thereof, and a thickness of the wetting layer is in a range from about 1 nanometer to about 10 nanometers.

14. The method as claimed in claim 12, wherein the material of the transition layer comprises of a material that is selected from the group consisting of copper, silver, and alloys thereof, and a thickness of the transition layer is in a range from about 1 nanometer to about 10 nanometers.

15. The method as claimed in claim 9, step (b) comprising forming an anti-oxidation layer on the conductive layer.

16. The method as claimed in claim 15, wherein the material of the anti-oxidation layer comprises of a material selected from the group consisting of gold, platinum, and alloys thereof, and a thickness of the anti-oxidation layer is in a range from about 1 nanometer to about 10 nanometers.

17. The method as claimed in claim 1, wherein the material of the strengthening layer comprises of a material that is selected from the group consisting of polyvinyl acetate, polyvinyl chloride, polyethylene, paraphenylene benzobisoxazole, and combinations thereof, and a thickness of the strengthening layer ranges from about 0.1 mocrometers to about 1 micrometer.

18. A method for making a carbon nanotube composite structure, the method comprising the steps of:
  (a) providing a carbon nanotube structure, the carbon nanotube structure being free-standing and comprising a plurality of carbon nanotubes aligned along a same direction and joined end to end by van der Waals attractive force therebetween; and
  (b) forming at least one conductive coating on a plurality of the carbon nanotubes in the carbon nanotube structure to achieve a carbon nanotube composite structure,
  (c) covering an outer surface of each of the plurality of carbon nanotubes with the at least one conductive coating, wherein the at least one conductive coating comprises of a conductive layer.

19. The method as claimed in claim 18, comprising forming a strengthening layer surrounding the at least one conductive coating; wherein forming the strengthening layer immersing the carbon nanotube structure with at least one conductive coating on the plurality of carbon nanotubes in a container with a liquid polymer; soaking an entire surface of the carbon nanotube structure with the liquid polymer; taking the carbon nanotube structure out of the container; and curing the liquid polymer on the carbon nanotube structure.

20. The method as claimed in claim 19, wherein the material of the strengthening layer comprises of a material that is selected from the group consisting of polyvinyl acetate, polyvinyl chloride, polyethylene, paraphenylene benzobisoxazole, and combinations thereof, and a thickness of the strengthening layer ranges from about 0.1 micrometers to about 1 micrometer.

* * * * *

UNITED STATES PATENT AND TRADEMARK OFFICE
CERTIFICATE OF CORRECTION

PATENT NO. : 8,268,398 B2  
APPLICATION NO. : 12/321570  
DATED : September 18, 2012  
INVENTOR(S) : Kai Liu et al.

Page 1 of 1

It is certified that error appears in the above-identified patent and that said Letters Patent is hereby corrected as shown below:

On the title page, please replace Item (73) regarding "Assignees" with the following:

(73) Assignees: Tsinghua University, Beijing (CN); Hon Hai Precision Industry Co., Ltd., Tu-Cheng, New Taipei (TW)

Signed and Sealed this  
Twenty-ninth Day of October, 2013

Teresa Stanek Rea  
*Deputy Director of the United States Patent and Trademark Office*